(12) United States Patent
Wippler

(10) Patent No.: US 9,112,505 B2
(45) Date of Patent: Aug. 18, 2015

(54) ILLUMINATED CAPACITIVE SWITCH BUTTON

(75) Inventor: Erik Anthony Wippler, Canton, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 1004 days.

(21) Appl. No.: 13/098,638

(22) Filed: May 2, 2011

(65) Prior Publication Data

US 2012/0279843 A1 Nov. 8, 2012

(51) Int. Cl.
*H03K 17/975* (2006.01)
*H03K 17/96* (2006.01)

(52) U.S. Cl.
CPC .......... *H03K 17/962* (2013.01); *H03K 17/9622* (2013.01); *H03K 2217/96079* (2013.01)

(58) Field of Classification Search
CPC . H03K 17/96; H03K 17/9622; H03K 17/975; G06F 3/044
USPC .......................................................... 200/600
See application file for complete search history.

(56) References Cited

U.S. PATENT DOCUMENTS

| 6,664,489 | B2 | 12/2003 | Kleinhans et al. | |
|---|---|---|---|---|
| 2008/0129701 | A1* | 6/2008 | Murakami | 345/173 |
| 2009/0040790 | A1* | 2/2009 | Payne | 362/632 |
| 2009/0050454 | A1 | 2/2009 | Matsukawa et al. | |
| 2009/0090611 | A1* | 4/2009 | Zeijlon et al. | 200/600 |
| 2010/0118560 | A1 | 5/2010 | Hayama et al. | |
| 2011/0090159 | A1* | 4/2011 | Kurashima | 345/173 |

* cited by examiner

*Primary Examiner* — Renee Luebke
*Assistant Examiner* — Lheiren Mae A Caroc
(74) *Attorney, Agent, or Firm* — Gifford, Krass, Sprinkle, Anderson & Citkowski, P.C.

(57) ABSTRACT

The present invention provides for an illuminated capacitive switch button assembly for use in an automotive vehicle dashboard assembly. The assembly further comprising a substrate, a printed circuit board (PCB) having at least one capacitive switch mounted to the printed circuit board, a light guide having at least one reflector disposed between the substrate and the printed circuit board, the printed circuit board and the substrate disposed at a predetermined distance from one another and a light source disposed on the edge of the light guide.

18 Claims, 2 Drawing Sheets

ILLUMINATED CAPACITIVE SWITCH BUTTON

FIELD OF THE INVENTION

This invention relates generally to capacitive switches. In particular, this invention relates to an illuminated capacitive switch button assembly for use in an automotive vehicle dashboard assembly.

BACKGROUND OF THE INVENTION

Many products take advantage of using capacitive type switches. The capacitive switch eliminates the traditional push button by having a sensor pad behind a rigid substrate such as a touch surface. The capacitive switch allows for a very clean appearance without gaps. The use of capacitive switches also provides for improved cleaning of the vehicle dashboard. Traditional push buttons use a plurality of LEDs (or other light source) per button to backlight the button. Improved capacitive buttons include a rigid substrate free of button gaps such as a touch surface, a light guide, and a light source. The light guide is used to allow a single light source (or reduced number of light sources) to be used to allow illumination of more than one button. However, current capacitive switch designs require the sensor pad to be extremely close to the touch surface (rigid substrate) to help maintain acceptable switch sensitivity. This design requires the light guide and light source to be in between the touch surface and the sensor printed circuit board. Traditional light guides range between 3-4 mm thick which is too large of a distance to provide for accurate touch capability. If no light guide is used, an air gap of 5-15 mm is typically present to achieve uniform lighting. The presence of a thick light guide or large air gap thereby moving the capacitive sensors far away from the touch surface greatly reduces the switch sensitivity. Accordingly, there exists a need in the art to provide for a capacitive switch assembly providing for increased sensitivity and improved accuracy.

SUMMARY OF THE INVENTION

The present invention provides for an illuminated capacitive switch button assembly for use in an automotive vehicle dashboard assembly. The assembly further comprising a substrate, a printed circuit board (PCB) having at least one capacitive switch mounted to the printed circuit board, a light guide having at least one reflector disposed between the substrate and the printed circuit board, the printed circuit board and the substrate disposed at a predetermined distance from one another and a light source disposed on the edge of the light guide. The predetermined distance between the printed circuit board and the display surface or substrate is between 0.5-2.9 mm. The reflectors connected with the light guide are micro reflectors or nano reflectors positioned in areas requiring increased light. The substrate includes printed graphics or painted on graphics displayed on a first surface of the substrate.

DETAILED DESCRIPTION OF THE INVENTION

The present invention provides for an illuminated capacitive switch button assembly for use in an automotive vehicle dashboard assembly easily accessible to a user. The capacitive switch type button assembly is highly preferred in the art by users due to its sleek appearance and easy maintenance. Generally, the present invention includes a substrate, a printed circuit board (PCB), a capacitive switch, a light guide having at least one reflector, and a light source disposed on the edge of the light guide.

Figure 1:
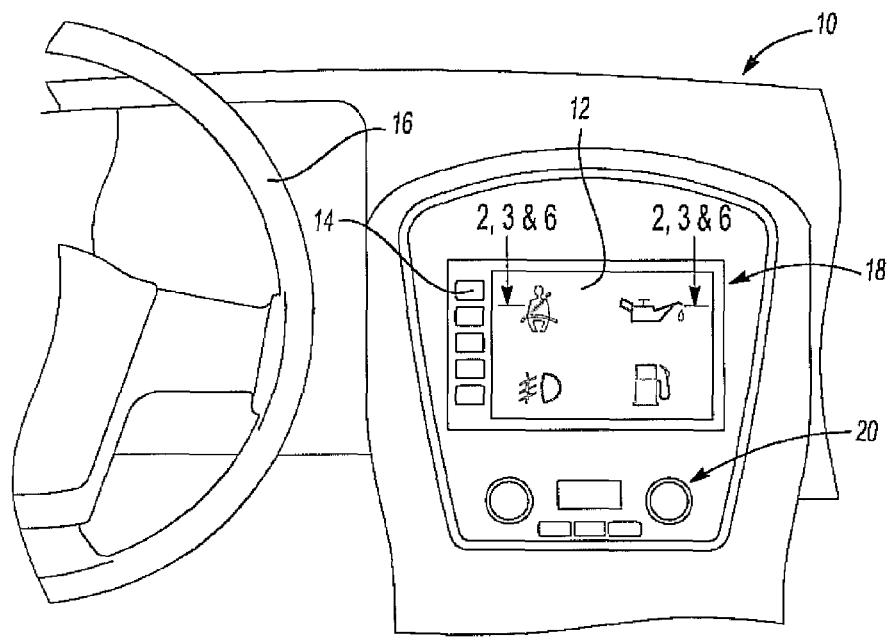
FIG. 1 is an environmental view of an automotive vehicle dashboard.

FIG. 1 shows an environmental view of the dashboard assembly 10 in a typical motor vehicle. The dashboard assembly 10 includes display surface 12 and plurality of buttons 14. The display surface 12 includes a plurality of indicator elements such as low fuel, brights indicator, maintenance required, and seatbelt warnings. Alternatively, the display surface 12 may include GPS navigation or radio systems. The display surface 12 provides for use of a capacitive switch according to the present invention. The dashboard assembly 10 further includes radio controls 20 and dashboard plate 18. Although the present invention is shown used in connection with a vehicle dashboard assembly 10, the use and design of a capacitive switch according to the present invention may be used in other circumstances aside from automotive use.

Figure 2:
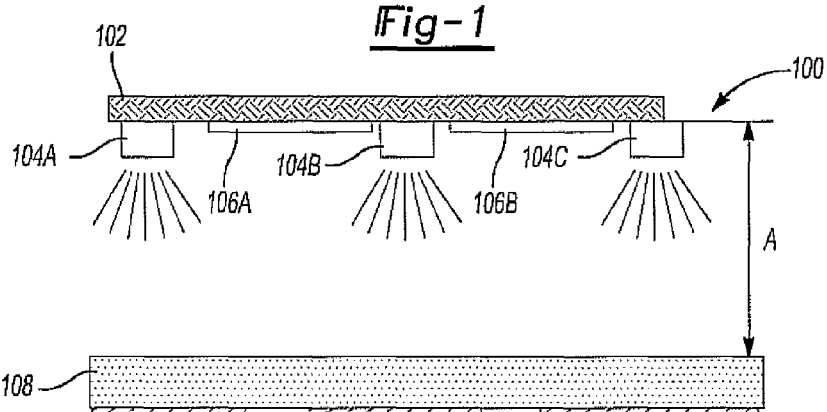
FIG. 2 is a cross sectional side view of one embodiment of the prior art.
Figure 3:
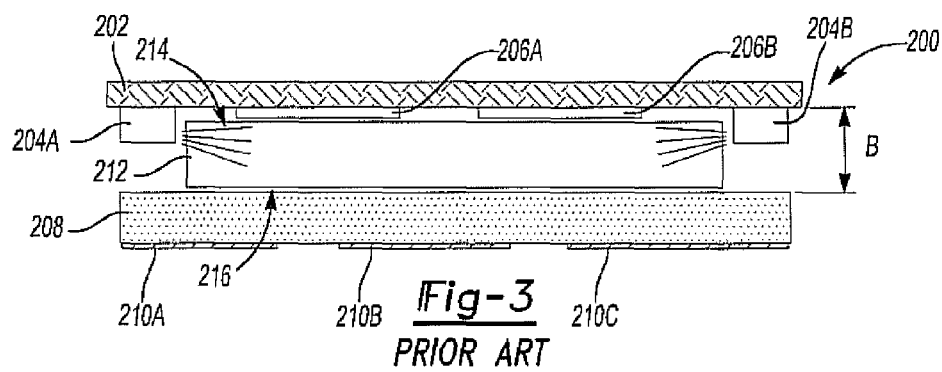
FIG. 3 is a cross sectional view of a secondary embodiment of the prior art.

The prior art, as shown in FIGS. 2 and 3, lacks the usability and sensitivity in the capacitive switch as compared to the present invention. The first embodiment of the prior art 100, as shown in FIG. 2, includes a base 102 having a plurality of LEDs 104a, 104b, 104c mounted thereon. The LEDs 104a, 104b, 104c are preferred over other lighting elements, such as light bulbs, due to cost efficiency, weight, and space saving requirements. The LEDs 104a, 104b, 104c may also be colored or textured to provide various lighting characteristics. Furthermore, the base 102 includes capacitive sensors 106a, 106b. A substrate 108 is provided in a parallel configuration as compared to the base 102 and separated a distance A apart from the base 102. The substrate 102 further includes a plurality of graphics or painted surfaces 110a, 110b, 110c. The graphics 110a, 110b, 110c may be pictorial or alphanumeric indicators provided at the convenience of the user. The substrate 108 is a smoked or dark tinted substrate giving the appearance of a smoky finish to the user. In this embodiment of the prior art, the predetermined distance A is between 10-15 mm. 10-15 mm of distance is required between the LEDs 104a, 104b, 104c and the substrate 108 to achieve proper lighting as viewed by the user. However, the predetermined distance A does not allow for good capacitive sensor sensitivity and thus is improved upon by the present embodiment of the present invention.

FIG. 3 shows a secondary embodiment of the prior art lighting assembly 200. A base 202 is provided including two LEDs 204a, 204b. The LEDs 204a, 204b are mounted to the base 202. Furthermore, capacitive sensors 206a, 206b are provided mounted to the base 202. A substrate 208 includes printed or painted on graphics 210a, 210b, 210c. Again, as in the previous prior art embodiment, the substrate 208 is smoked or dark tinted to provide a dark appearance to the user. A light guide 212 is provided between the base 202 and the capacitive sensors 206a, 206b and the substrate 208. The LEDs 204a, 204b are provided adjacent the light guide 212 to direct light down the light guide 212. The base 202 and the substrate 208 include the light guide 212 provided between the two in a parallel arrangement. The base 202 and the substrate 208 are provided at a predetermined distance B between one another. The predetermined distance B is approximately 3 mm. However, the predetermined distance B of 3 mm of distance still does not provide for adequate capacitive sensor sensitivity. Furthermore, the backlighting and lighting provided by the light guide 212 in the present arrangement is not uniform to the user. Accordingly, there exists a strong need, which is solved by the present invention, to provide a lighting assembly providing for adequate capacitive sensor sensitivity and uniform backlighting of the capacitive switches.

The present invention provides for a base or PCB 302 wherein an LED 304 is mounted to the PCB 302. The LED 304 may be mounted to the PCB 302 by an adhesive or other hardware means. Alternatively, the LED 304 is a different light source such as a light bulb. The PCB 302 further includes capacitive sensors 306a, 306b. The capacitive sensors 306a, 306b are mounted to the PCB 302 by means of an adhesive or other hardware connecting means. The PCB 302 further includes an upper surface 302a and a lower surface 302b. The capacitive sensors 306a, 306b also further include an upper surface 307a and a lower surface 307b. In the present embodiment a thin layer of adhesive 336 is provided between the upper surface 307a of the capacitive sensor 306a and the lower surface 302b of the PCB 302.

Separated away from and parallel to the PCB 302 is arranged the substrate 308. The substrate 308 is viewed by the user 350 when fully assembled. The substrate 308 is tinted a dark color or smoked to give the substrate 308 a dark appearance. The substrate 308 is darkened to prevent the user 350 from viewing the parts behind the substrate 308 while still translucent enough to allow light from the LED 304 to shine through the substrate 308. The substrate 308 further includes a plurality of graphics (painted or printed on the substrate 308) shown at 310a, 310b, 310c. The graphics 310a, 310b, 310c are used to indicate to the user 350 of a vehicle what the user 350 is selecting. The graphics 310a, 310b, 310c may be used for a plurality of different indicating means or selection means for the user 350. The substrate 308 further includes an upper surface 308a and a lower surface 308b. In the present embodiments, the graphics 310a, 310b, 310c are provided on the lower surface 308b of the substrate 308. Alternatively, the graphics 310a, 310b, 310c may be provided on the upper surface 308a of the substrate 308. Furthermore, and alternatively, the graphics 310a, 310b, 310c are provided on a separate piece of material provided either at the upper surface 308a or the lower surface 308b. The separate piece of material is thin thereby not disrupting the capacitive switch sensitivity.

Provided between the PCB 302 and the substrate 308 is a light guide 312. The light guide 312 includes a plurality of reflectors 380a, 380b. The light guide 312 has a predetermined thickness C. In the present embodiment, the predetermined thickness C is 1.2 mm. Furthermore, in the present embodiment, the reflectors 380a, 380b are nano reflectors. The nano reflectors 380a, 380b are molded into the light guide 312. The light guide 312 includes cavities 390a, 390b to accept the reflectors 380a, 380b. The LED 304 provided on the PCB 302 directs light 303. The light 303 is directed down the light guide 312 and reflected to the user 350 by means of the plurality of reflectors or nano reflectors 380a, 380b. The nano reflectors 380a, 380b are molded into key locations near the button locations. The nano reflectors 380a, 380b may also be present in other non button areas that require illumination.

In the present embodiment, the LED 304 is a side emitting LED positioned at the edge of the light guide 312. Light 303 is concentrated at the nano reflectors 380a, 380b, allowing even lighting at the areas where the nano reflectors 380a, 380b are positioned.

In the present embodiment, only one or two LEDs 304 are required to illuminate numerous switches. Therefore, part count, cost, and power consumption are all reduced.

The light guide 312 further includes an upper surface 312a and a lower surface 312b. The substrate 308 and the light guide 312 are provided as close to one another as possible. Furthermore, the PCB 302, the capacitive sensors 306a, 306b, and the light guide 312 are also positioned as close as possible. In the present embodiment, the lower surface 302a of the PCB 302 and the upper surface 308a of the substrate 308 are provided as close as possible and separated by a predetermined distance D. In the present embodiment, the predetermined distance D is 1.3 mm. Various embodiments and other designs may provide for varying predetermined distances D.

The reflectors 380a, 380b and the light guide 312 connect to the substrate 308 by means of an adhesive 320. In the present embodiment, the reflectors 380a, 380b are in direct contact only separated by the adhesive 320 to the upper surface 308a of the substrate 308. In an alternative embodiment, the lower surface 312b of the light guide 312 is in direct contact, only separated by the adhesive 320, to the upper surface 308a of the substrate 308. Furthermore and alternatively, the reflectors 380a, 380b are provided mounted and contained fully within the light guide 312 thereby not contacting the substrate 308 at all. Different embodiments and design requirements dictate where the reflectors 380a, 380b are positioned.

Figure 4:
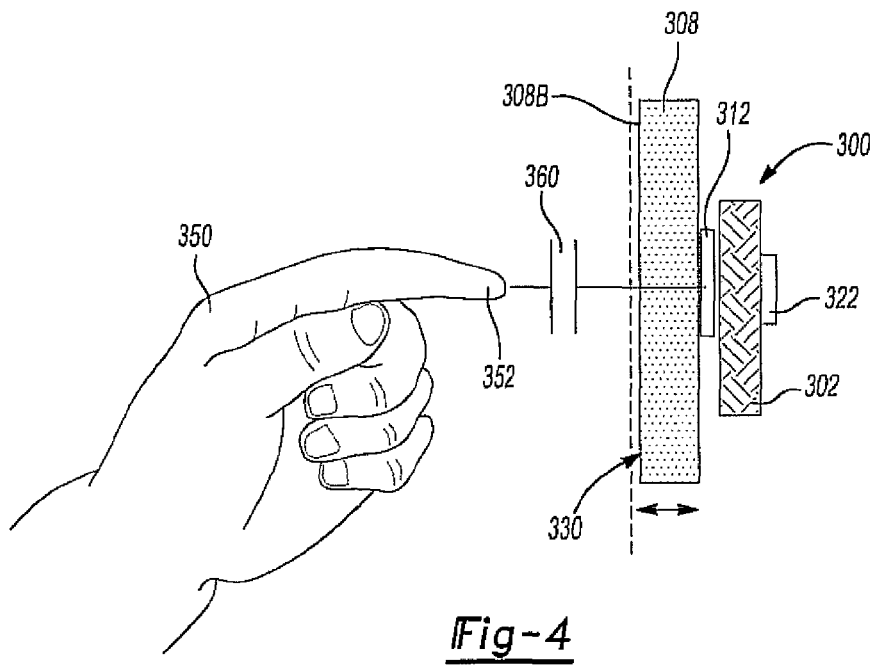
FIG. 4 is a perspective and cross sectional view of the capacitive switch assembly.
Figure 5:
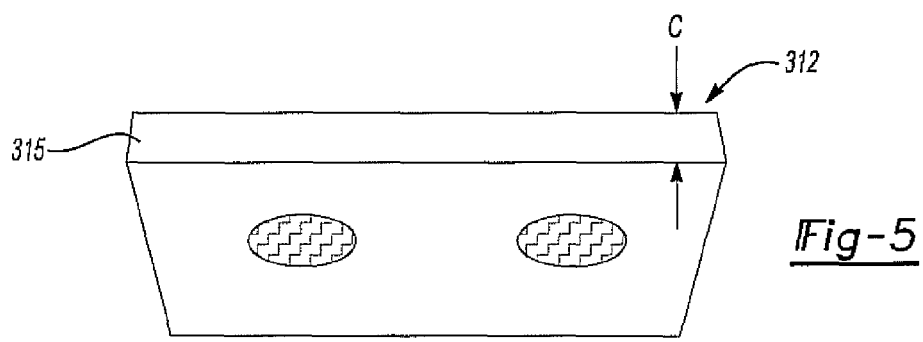
FIG. 5 is a perspective view of the light guide including a plurality of reflectors.
Figure 6:
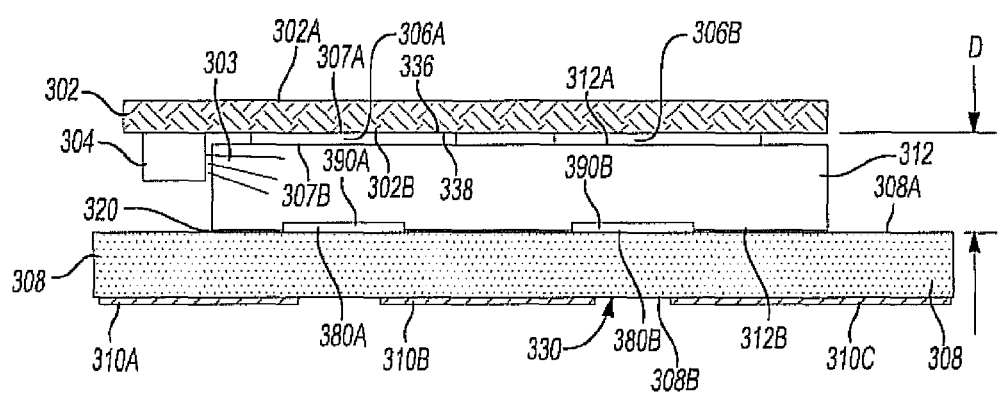
FIG. 6 is a cross sectional view of the present preferred embodiment of the capacitive switch button assembly.

When in use, the user 350 touches the first surface 330 or the lower surface 308b of the substrate 308 where the printed graphic 310a, 310b, 310c is provided. The touching action is shown in FIG. 4 at numeral 360. Once the user 350 presses the switch area or graphical indicator 310a, 310b, 310c, the action is taken and the button is pushed.

The invention is not restricted to the illustrative examples and embodiments described above. The embodiments are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

I claim:

1. An illuminated capacitive switch button assembly for use in an automotive vehicle dashboard assembly, the assembly comprising:
    a substrate;
    a printed circuit board having at least one capacitive switch mounted to the printed circuit board;
    a light guide having at least one reflector disposed between the substrate and the printed circuit board having the at least one capacitive switch, the printed circuit board and the substrate disposed a predetermined distance from one another, the predetermined distance between the printed circuit board and the substrate is between 0.5-2.9 millimeters; and
    a light source disposed on an edge of the light guide.

2. The assembly of claim 1, wherein the reflectors of the light guide are micro reflectors.

3. The assembly of claim 1, wherein the reflectors are embedded within the light guide.

4. The assembly of claim 1, wherein the substrate and the reflectors are in direct planar contact providing for a small gap between the substrate and the light guide.

5. The assembly of claim 1, wherein the substrate and light guide are in direct planar contact.

6. The assembly of claim 1, wherein capacitive sensors mounted to the printed circuit board are in direct planar contact with the light guide.

7. The assembly of claim 1, wherein the substrate includes a first planar display surface viewable and touchable by an operator of an automotive vehicle.

8. The assembly of claim 7, wherein the substrate is translucent.

9. The assembly of claim 8, wherein the substrate is dark tinted.

10. The assembly of claim 9, wherein the substrate includes printed graphics displayed on the first surface.

11. The assembly of claim 1, wherein the light source is a light emitting diode (LED).

12. The assembly of claim 1, wherein the light guide is planar.

13. The assembly of claim 12, wherein the light guide is comparable in shape as compared to the printed circuit board.

14. The assembly of claim 1, wherein the reflectors of the light guide are nano-reflectors.

15. The assembly of claim 1, wherein a thin adhesive is disposed between the light guide and the printed circuit board.

16. The assembly of claim 1, wherein a thin layer of adhesive is disposed between the light guide and the substrate.

17. An illuminated capacitive switch button assembly for use in an automotive vehicle dashboard assembly, the assembly comprising:
    a substrate having transparent or translucent qualities, the substrate having a planar surface, the substrate further including printed graphics viewable by a user;
    a printed circuit board having at least one capacitive switch mounted to the printed circuit board;
    a light guide having at least one reflector disposed between the substrate and the printed circuit board having the at least one capacitive switch, the printed circuit board and the substrate disposed a predetermined distance from one another, the predetermined distance small enough to enable increased capacitive switch sensitivity wherein the predetermined distance between the printed circuit board and the substrate is between 0.5-2.9 millimeters; and
    a light source disposed on an edge of the light guide wherein light from the light source shines down the light guide and through the substrate providing for viewing by the user of the printed graphics disposed on the substrate.

18. An illuminated capacitive switch button assembly for use in an automotive vehicle dashboard assembly, the assembly comprising:
    a substrate having printed graphics;
    a printed circuit board spaced apart from the substrate having printed graphics, the printed circuit board having at least one capacitive switch;
    a light source disposed on an edge of a light guide, the light guide having at least one reflector, the light guide disposed between the substrate and the printed circuit board, the printed circuit board having the at least one capacitive switch, the printed circuit board and the substrate disposed a predetermined distance from one another, the predetermined distance is between 0.5-2.9 millimeters,
    the at least one reflector molded into the light guide, the at least one reflector spaced apart from the printed circuit board, the at least one reflector connected to the substrate and adapted to illuminate a button portion of the substrate.

* * * * *